US006429585B1

(12) United States Patent
Kitazume et al.

(10) Patent No.: US 6,429,585 B1
(45) Date of Patent: Aug. 6, 2002

(54) ORGANIC THIN FILM EL PANEL AND METHOD OF MANUFACTURING THE SAME

(75) Inventors: Eiichi Kitazume; Kazuhiro Mizutani, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/499,351

(22) Filed: Feb. 8, 2000

(30) Foreign Application Priority Data

Feb. 12, 1999 (JP) ............................................. 11-034853

(51) Int. Cl.[7] ................................................ H01J 63/04
(52) U.S. Cl. ........................ 313/505; 313/504; 313/506; 313/503
(58) Field of Search ................................. 313/500, 505, 313/504, 506, 503

(56) References Cited

U.S. PATENT DOCUMENTS 6,075,317 A  *  6/2000  Keyser et al. ............... 313/505

6,259,423 B1  *  7/2001  Tokito et al. ................. 345/76

* cited by examiner

Primary Examiner—Sandra O'Shea
Assistant Examiner—Ali Alavi
(74) Attorney, Agent, or Firm—Foley & Lardner (57) ABSTRACT

An organic thin film EL panel includes a plurality of transparent electrodes, an organic film, and a plurality of metal electrodes. The transparent electrodes are formed into stripes on a transparent substrate. The organic film includes a light-emitting layer and is formed on the transparent substrate and the transparent electrodes. The plurality of metal electrodes are formed into stripes on the organic film in a direction perpendicular to the transparent electrodes. The metal electrodes are comprised of a plurality of electrode portions arranged at a predetermined interval, and a plurality of interconnections that connect adjacent ones of the electrode portions to each other. The electrode portions have pixel regions where the metal electrodes and the transparent electrodes overlie each other, and connection regions other than the pixel regions. The interconnections connect the connection regions of adjacent ones of the electrode portions to each other. A method of manufacturing an organic thin film EL panel is also disclosed.

11 Claims, 5 Drawing Sheets

ORGANIC THIN FILM EL PANEL AND METHOD OF MANUFACTURING THE SAME

BACKGROUND OF THE INVENTION

The present invention relates to an organic thin film EL (ElectroLuminescence) panel and, more particularly, to the structure of a metal electrode in an EL panel and a method of manufacturing the same.

An organic thin film EL element is a light-emitting element having a transparent support substrate, transparent electrode, organic thin film, and metal electrode. The transparent support substrate is made of, e.g., glass. The transparent electrode is formed on the transparent substrate and made of, e.g., ITO (Indium Tin Oxide). The organic thin film is comprised of a hole transport layer, a light-emitting layer, and an electron transport layer, and is formed on the transparent substrate including the transparent electrode. The metal electrode is formed on the organic thin film and made of a metal having a small work function. In the organic thin film EL element having this arrangement, when the transparent electrode is set at a positive voltage and a DC voltage of about 10 V is applied across the transparent electrode and the metal electrode, holes emitted from the transparent electrode and electrons emitted from the metal electrode are recombined with each other in a light-emitting layer to emit light. Therefore, light is emitted from the transparent support substrate.

The transparent electrode has the function of an anode and a function of transmitting emitted light therethrough, and is mainly made of ITO. The hole transport layer has a function of facilitating hole injection from the anode, a function of transporting holes, and a function of interfering with electrons. To form the hole transport layer, tetraphenyldiamine (TPD), a hydrazone derivative, a triazole derivative, polythiophene, or the like is used. The light-emitting layer has a hole and electron injecting function, a hole and electron transporting function, and a light-emitting function by recombination of the holes and electrons. To form the light-emitting layer, an organic metal complex such as tris(8-quinolilite)aluminum, quinacridone, rubrene, perylene, or the like is used.

The electron transport layer has a function of facilitating electron injection from the metal electrode, an electron transport function, and a hole interfering function. To form the electron transport layer, an organic metal complex such as tris(8-quinolilite)aluminum, a perylene derivative, a pyridine derivative, a quinoline derivative, or the like is used. The metal electrode has the function as a cathode. To effectively perform electron injection, the metal electrode is made of a metal element, e.g., lithium, magnesium, aluminum, or silver, having a small work function alone, or of a magnesium-silver alloy or lithium-aluminum alloy to improve the stability.

Figure 8A:
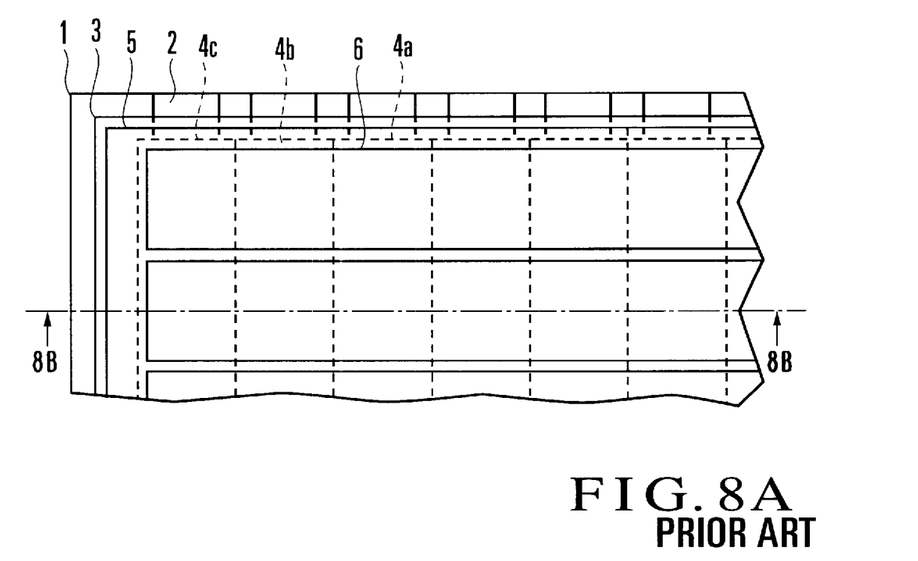
FIG. 8A is a plan view of a conventional dot matrix color organic thin film EL panel.
Figure 8B:
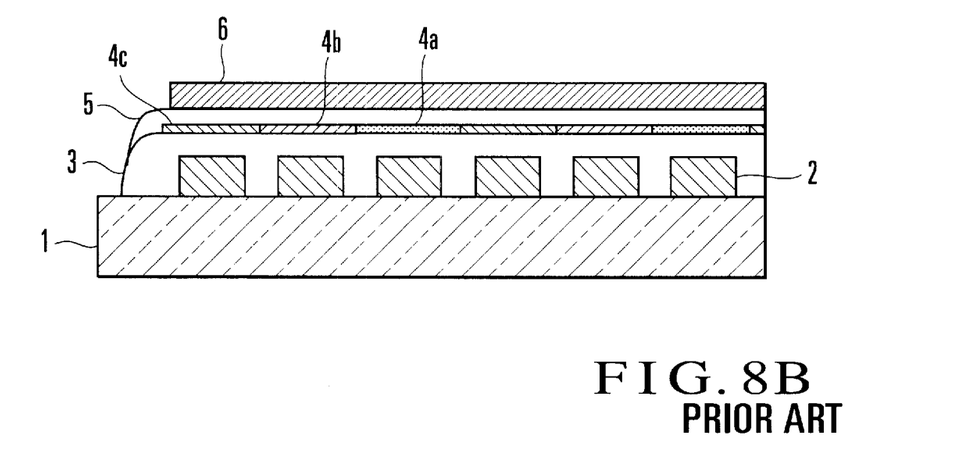
FIG. 8B is a sectional view taken along the line 8B—8B in FIG. 8A.

FIGS. 8A and 8B show the arrangement of a conventional dot matrix color organic thin film EL panel using such an organic thin film EL element.

Referring to FIG. 8B, a plurality of transparent electrodes 2 are formed on a transparent support substrate 1 into stripes at a predetermined interval, and a hole transport layer 3 is formed on the transparent support substrate 1 and transparent electrodes 2. As shown in FIG. 8A, a red-emitting layer 4a, green-emitting layer 4b, and blue-emitting layer 4c are formed on the hole transport layer 3 alternately to correspond to the transparent electrodes 2, such that they are parallel to the transparent electrodes 2. An electron transport layer 5 is formed on the red-emitting layer 4a, green-emitting layer 4b, and blue-emitting layer 4c. A plurality of metal electrodes 6 are formed on the electron transport layer 5 into stripes in a direction perpendicular to the transparent electrodes 2.

In this arrangement, when the transparent electrodes 2 are set at a positive voltage and a DC voltage is applied across the transparent electrodes 2 and metal electrodes 6, portions where the transparent electrodes 2 and metal electrodes 6 overlie each other emit light. These light-emitting overlying section are used as pixels.

A method of manufacturing the color organic thin film EL panel having the above arrangement will be described.

A transparent conductive film made of ITO or the like is formed on the transparent support substrate (to be referred to as the transparent substrate hereinafter) 1 made of glass or the like by sputtering, and then the transparent electrodes 2 are formed into stripes by photolithography and wet etching. TPD or the like is vacuum-deposited to form the hole transport layer 3 covering the transparent substrate 1 and transparent electrodes 2. The red-emitting layer 4a, green-emitting layer 4b, and blue-emitting layer 4c are sequentially formed on the hole transport layer 3 by using a shadow mask scheme to be parallel to the transparent electrodes 2, such that they are adjacent to each other in this order. Tris(8-quinolilite)aluminum or the like is vacuum-deposited to form the electron transport layer 5 on the red-, green-, and blue-emitting layers 4a to 4c.

A metal mask having striped openings is formed on the transparent substrate 1 on the electron transport layer 5 side such that its openings are perpendicular to the transparent electrodes 2. Metals, e.g., magnesium and silver, or lithium and aluminum, having small work functions are deposited simultaneously to form the metal electrodes 6. The metal mask is then removed, and a protection film (not shown) made of an inorganic material such as $SiO_2$, or an organic material such as a fluoroplastic is formed by sputtering. Finally, to prevent humidity invasion, a sealing plate such as a glass plate is adhered with a low-hygroscopic photosetting adhesive, epoxy-based adhesive, or silicone-based adhesive or the like, thereby hermetically sealing the obtained structure.

The metal electrodes are formed by vacuum deposition using the metal mask due to the following reason. Since the organic thin film is not resistant to water and has a low durability against an organic solvent or chemicals, pattern formation by photolithography and wet etching cannot be performed.

In the metal electrode forming method described above, since the metal is deposited in stripes, the electrodes and interconnections are formed integrally. The film thickness cannot be increased to prevent pixel portions from being damaged by heat radiated during metal vapor deposition. Therefore, the interconnection resistance of the metal electrodes increases. Also, the interconnection resistance changes depending on the positions of the pixels, resulting in variations in brightness of the pixels. To prevent these problems, conventionally, even after the alloy to form the electrodes is deposited, deposition of the metal having a lower resistivity is continued to decrease the interconnection resistance.

In the metal electrode forming method described above, the alloy must be deposited at a low deposition rate so that the mixing ratio of the alloy becomes constant. This prolongs a time required for electrode formation. Since the metal having a lower resistivity is continuously deposited, heat radiated from the vapor source increases the substrate temperature to be equal to the glass transition temperature or more of the organic film. Then, the organic film may agglomerate to form corrugations on its surface, or a pinhole may be formed in the film to short-circuit the transparent electrodes and the metal electrodes.

SUMMARY OF THE INVENTION

It is an object of the present invention to provide an organic thin film EL panel having a metal electrode having a low interconnection resistance, and a method of manufacturing the same.

It is another object of the present invention to provide an organic thin film EL panel in which glass transition of an organic film caused by heat radiated from a vapor source during metal electrode formation is prevented, and a method of manufacturing the same.

In order to achieve the above object, according to the present invention, there is provided an organic thin film EL panel comprising a plurality of transparent electrodes formed into stripes on a transparent substrate, an organic deposition film including a light-emitting layer and formed on the transparent substrate and the transparent electrodes, and a plurality of metal electrodes formed into stripes on the organic deposition film in a direction perpendicular to the transparent electrodes, the metal electrodes being comprised of a plurality of electrode portions arranged at a predetermined interval, and a plurality of interconnections that connect adjacent ones of the electrode portions to each other, the electrode portions having pixel regions where the metal electrodes and the transparent electrodes overlie each other, and connection regions other than the pixel regions, and the interconnections connecting the connection regions of adjacent ones of the electrode portions to each other.

DESCRIPTION OF THE PREFERRED EMBODIMENTS

The present invention will be described in detail with reference to the accompanying drawings.

Figure 1A:
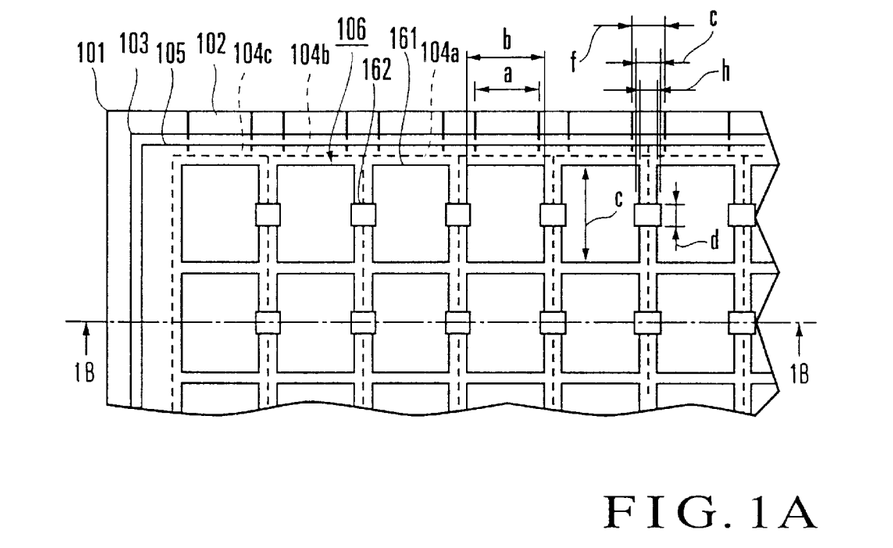
FIG. 1A is a plan view of a color organic thin film EL panel according to the first embodiment of the present invention.
Figure 1B:
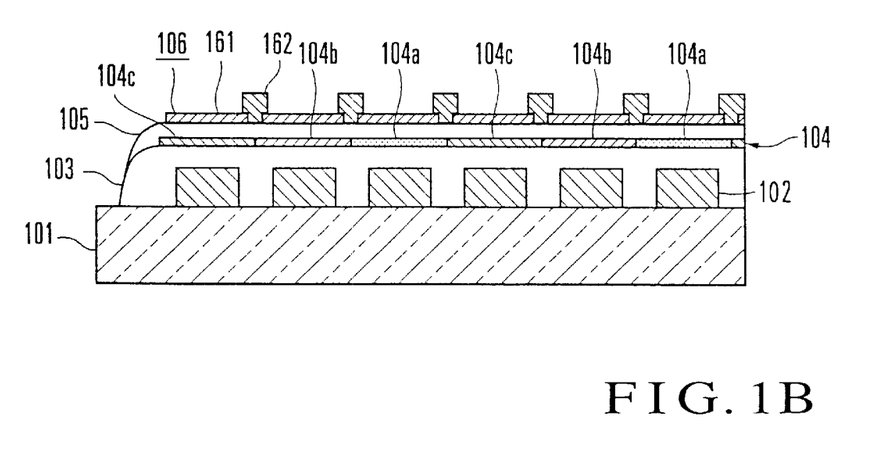
FIG. 1B is a sectional view taken along the line 1B—1B in FIG. 1A.

FIGS. 1A and 1B show a color organic thin film EL panel according to the first embodiment of the present invention. Referring to FIG. 1B, in the color organic thin film EL panel, a plurality of parallel transparent electrodes 102 are formed on a transparent support substrate (to be referred to as a transparent substrate hereinafter) 101 equidistantly into stripes. A hole transport layer 103 is formed to cover the transparent substrate 101 and transparent electrodes 102. A red-emitting layer 104a, green-emitting layer 104b, and blue-emitting layer 104c which form a light-emitting layer 104 are formed on the hole transport layer 103 to be parallel to the transparent electrodes 102, such that they correspond to the transparent electrodes 102. The red-emitting layer 104a, green-emitting layer 104b, and blue-emitting layer 104c are formed adjacent to each other with a predetermined repetition pattern. An electron transport layer 105 is formed on the light-emitting layer 104.

A plurality of parallel metal electrodes 106, each comprised of an electrode portion 161 and an interconnection 162, are formed on the electron transport layer 105 into stripes in a direction perpendicular to the transparent electrodes 102. Each electrode portion 161 is formed in a region overlying the transparent electrode 102, and forms a rectangular shape having two sides corresponding to a pattern length a and a pattern width b. As shown in FIG. 1A, the pattern length b is longer than a pattern width a of the transparent electrodes 102, and the pattern width c corresponds to the vertical width of the pixel.

The interconnections 162 are arranged to connect the electrode portions 161 to each other in a direction perpendicular to the transparent electrodes 102. Each interconnection 162 forms a rectangular shape having two sides corresponding to a pattern length e and a pattern width d. As shown in FIG. 1A, the pattern length e is shorter than an insulating distance f among the transparent electrodes 102 and longer than an insulating distance h among the electrode portions 161. The pattern width d is shorter than the pattern width c of the electrode portions 161.

Figure 2:
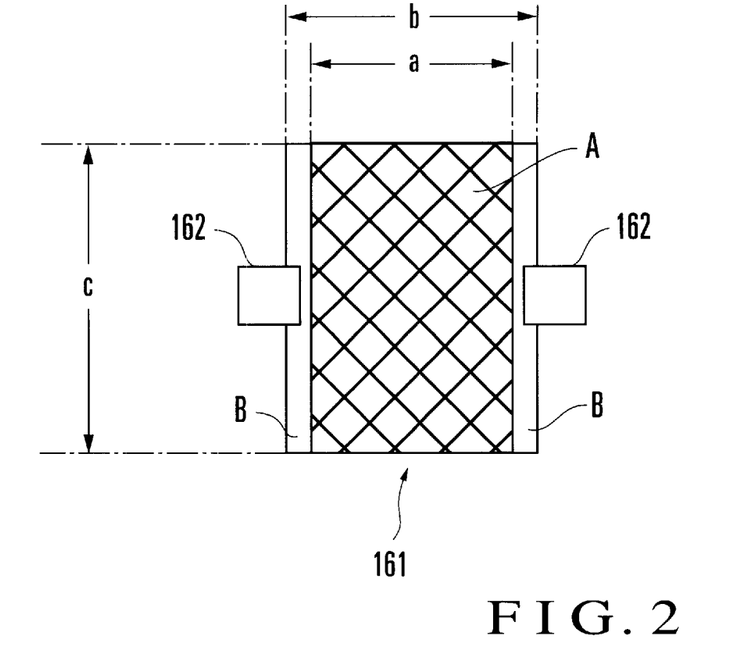
FIG. 2 is a view showing a pixel region which forms an electrode portion and a connection region shown in FIG. 1A.

In this arrangement, as shown in FIG. 2, a pixel A having a horizontal width corresponding to the pattern width a of the transparent electrode 102 and a vertical width corresponding to the pattern width c of the electrode portion 161 is formed in a region where the transparent electrode 102 and electrode portion 161 overlie each other. A connecting portion B having a width of (b−a)/2 is formed at each of two sides of the electrode portion 161 in a direction parallel to the metal electrode 106, i.e., at each of opposing sides of each of the electrode portions 161 which are adjacent to each other.

The transparent substrate 101 is a glass substrate, and has a thickness of 1.1 mm. The transparent electrodes 102 are made of ITO films each having a thickness of 100 nm, a sheet resistance of 15 $\Omega/\square$, and a pattern width a of 0.2 mm, and are arranged at a predetermined interval such that the insulating distance f becomes 0.1 mm.

The hole transport layer 103 is made of N, N'-diphenyl N,N' bis($\alpha$-naphthyl)-1,1'-biphenyl-4,4'-diamine (to be abbreviated as $\alpha$-NPD hereinafter), and has a thickness of 50 nm on the transparent electrodes 102. The red-emitting layer 104a is formed of a 50-nm thick organic film obtained by doping a tris(8-quinolilite) aluminum complex (to be abbreviated as $Alq_3$ hereinafter) with 4-dicyanomethylene-2-methyl-6-(p-dimethylaminostyryl)-4H-pyran (to be abbreviated as DCM) hereinafter at a concentration of 5 wt %. The green-emitting layer 104b is formed of a 50-nm thick organic film obtained by doping $Alq_3$ with quinacridone at a concentration of 5 wt %. The blue-emitting layer 104c is formed of a 50-nm thick perylene film. The electron transport layer 105 is formed of a 50-nm thick Alq$_3$ film.

The electrode portions 161 are made of a magnesium-silver alloy having a magnesium-to-silver ratio of 10:1, and their thickness is set to 50 nm so the organic film will not be damaged by heat radiated from the vapor source even with a low vapor deposition rate. The pattern length b of the electrode portions 161 is determined so that, when depositing the interconnections 162, the pixels are masked to protect the organic films from heat radiated from the vapor source. More specifically, the pattern length b is set to 0.25 mm, which is larger than the pattern width a of the transparent electrodes 102, so the connecting portions connected to the interconnections 162 may not be formed on the pixels. The insulating distance h among the electrode portions 161 is set to 0.05 mm. The interconnections 162 are made of copper to decrease the interconnection resistance. The thickness of the interconnections 162 is set to 1,000 nm, and their pattern length e is set to 0.08 mm.

A method of manufacturing the color organic thin film EL panel having the above arrangement will be described.

A 100-nm thick ITO film is formed on the 1.1-mm thick glass substrate 101 by sputtering, and the transparent electrodes 102 having an interconnection pitch of 0.3 mm and the pattern width a of 0.2 mm are formed by photolithography and wet etching.

The glass substrate 101 on which the transparent electrodes 102 are formed is placed in a vacuum deposition apparatus. The interior of the chamber is evacuated by a vacuum pump to $1\times10^{-3}$ Pa or less, and α-NPD is uniformly deposited on the transparent electrodes 102 to a thickness of 50 nm to form the hole transport layer 103. Each time the interior of the chamber is evacuated for subsequent vapor deposition, the pressure for evacuation is $1\times10^{-3}$ Pa or less.

The light-emitting layer 104 is formed by the shadow mask scheme in the order of the red-emitting layer 104a, green-emitting layer 104b, and blue-emitting layer 104c on the hole transport layer 103 to be parallel to the transparent electrodes 102, so as to correspond to the transparent electrodes 102.

This will be described in detail. By using a shadow mask for a red-emitting layer, Alq$_3$ and DCM are uniformly co-deposited to a thickness of 50 nm at such a deposition rate that the doping concentration becomes 5 wt %, thereby forming the red-emitting layer 104a. Then, by using a shadow mask for a green-emitting layer, Alq$_3$ and quinacridone are uniformly co-deposited to a thickness of 50 mm at such a deposition rate that the doping concentration becomes 5 wt %, thereby forming the green-emitting layer 104b. By using a shadow mask for a blue-emitting layer, perylene is uniformly deposited to a thickness of 50 nm, thereby forming the blue-emitting layer 104c.

After the light-emitting layer 104 is formed, Alq$_3$ is uniformly deposited to a thickness of 50 nm, thereby forming the electron transport layer 105 on the light-emitting layer 104.

Figure 3:
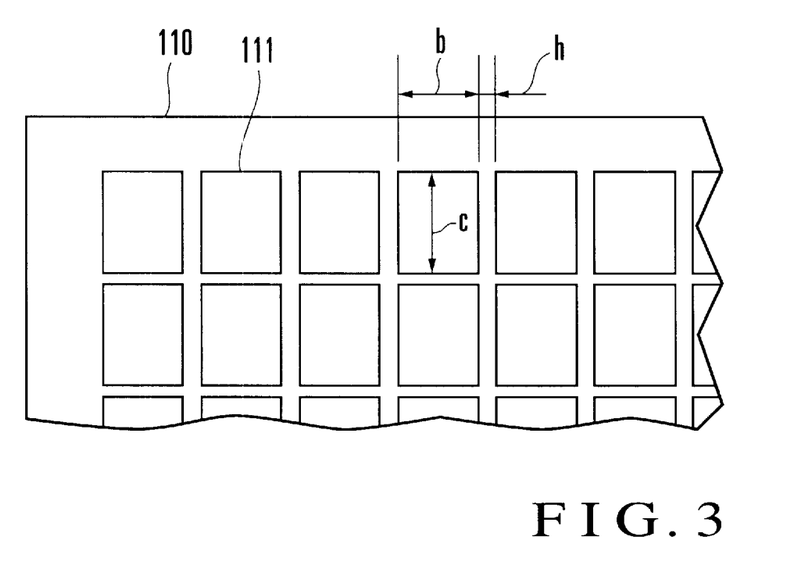
FIG. 3 is a plan view of an electrode portion metal mask used for the manufacture of the EL panel shown in FIGS. 1A and 1B.

To form the electrode portions 161, an electrode portion metal mask 110 shown in FIG. 3 is attached to the glass substrate 101 on which the electron transport layer 105 is formed. The metal mask 110 is a metal thin plate made of SUS 304, on which openings 111 for the electrode portions are formed in a matrix. The openings 111 are formed such that their pattern length b with respect to the pattern width a of the transparent electrodes 102 satisfies b>a, so as to allow connecting the interconnections 162 to the connecting portions B located outside the pixel regions A, as described above.

A mask fixing holder (not shown) is attached to the metal mask 110, and is set to face the glass substrate 101 on which another fixing holder (not shown) is fixed. The two holders are fixed such that a gap j between the electron transport layer 105 and metal mask 110 becomes 10 μm.

The glass substrate 101 to which the metal mask 110 is attached is placed in the vacuum deposition apparatus, and the interior of the chamber is evacuated by the vacuum pump to $1\times10^3$ Pa or less. Magnesium and silver placed in separate resistance heating boats are heated to evaporate, so that the 50-nm thick electrode portions 161 are formed on the electron transport layer 105 at such a deposition rate that a magnesium-to-silver ratio becomes 10:1.

Figure 4:
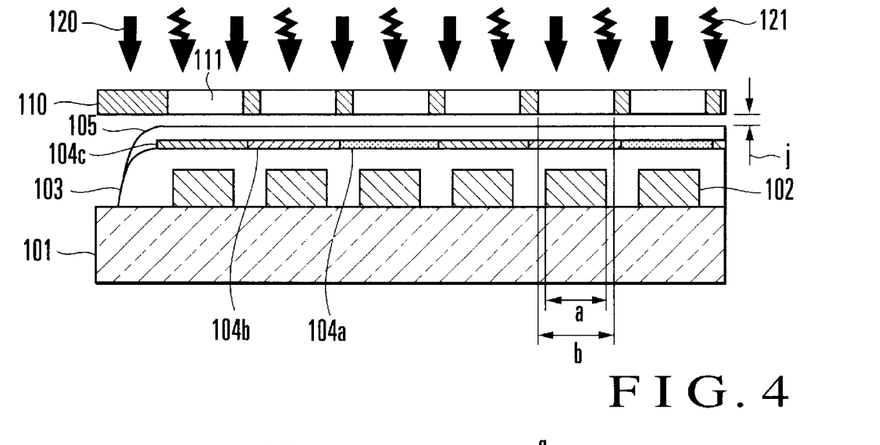
FIG. 4 is a view showing a process of forming the electrode portions shown in FIGS. 1A and 1B.

FIG. 4 shows a process of forming the electrode portions 161. Referring to FIG. 4, a deposition material 120 is deposited on only the openings 111 corresponding to the electron transport layer 105 through the metal mask 110, thereby forming the electrode portions 161 into a matrix. The thickness of the electrode portions 161 is determined by the material that forms the electrode portions and substrate temperature rise caused by radiation heat 121 from the vapor source, and preferably falls within a range of 10 nm to 500 nm.

The thickness of the electrode portions 161 is set to 10 nm or more due to the following reason. If the thickness is smaller than 10 nm, the electrode portions 161 form semi-transparent films. Then, light generated by the light-emitting layer 104 leaks to the lower side, and the organic thin film does not work in practice. The thickness of the electrode portions 161 is set to 500 nm or less due to the following reason. If the thickness is larger than this, the organic film of the light-emitting surface is damaged by the radiation heat.

Figure 5:
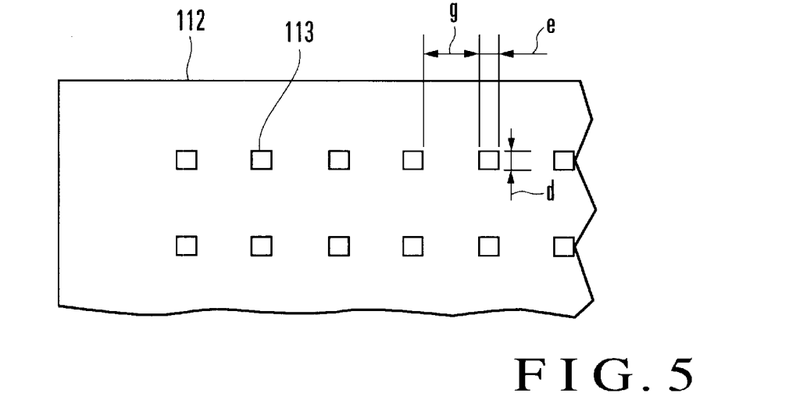
FIG. 5 is a plan view of an interconnection metal mask used for the manufacture of the EL panel shown in FIGS. 1A and 1B.

To form the interconnections 162, an interconnection metal mask 112 shown in FIG. 5 is attached to the glass substrate 101 formed with the electrode portions 161. The metal mask 112 is a metal plate made of SUS 304 and has interconnection openings 113. In order to mask the pixel regions A, a pattern width a of the transparent electrodes 102, a pattern length b of the electrode portions 161, and a length g of the mask portion are set to satisfy b≧g≧a. A pattern width d of the openings 113 with respect to the pattern length c corresponding to the longitudinal width of the pixel is set to satisfy d<c. This facilitates alignment of the metal mask 112. A pattern length e of the openings 113 with respect to the insulating distance f among the transparent electrodes 102 is set to satisfy e<f so as not to make the openings 113 overlie the pixel regions A.

Similarly to the electrode portion metal mask 110, the metal mask 112 is attached to the glass substrate 101 formed with the electrode portions 161, and is fixed such that a gap k between the electrode portions 161 and metal mask 110 becomes 10 μm.

The glass substrate 101 to which the metal mask 112 is attached is placed in the vacuum deposition apparatus, and the interior of the chamber is evacuated by the vacuum pump to $1\times10^{-3}$ Pa or less. Copper placed in a resistance heating boat is heated to evaporate, thereby forming the 1,000-nm thick electrode portions 161.

Figure 6:
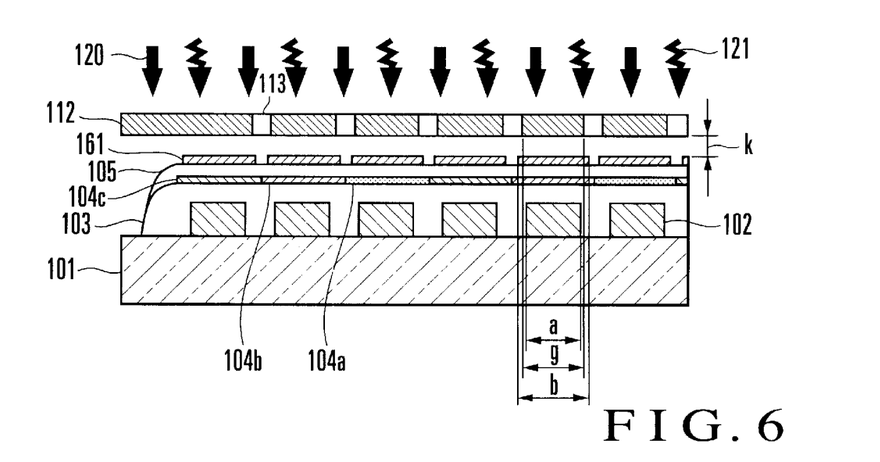
FIG. 6 is a view showing a process of forming the interconnections shown in FIGS. 1A and 1B.

FIG. 6 shows a process of forming the electrode portions 161. Referring to FIG. 6, the deposition material 120 is deposited on the connecting portions of the electrode portions 161 and the electron transport layer 105 exposed through the openings 113 of the metal mask 112, to form the interconnections 162. The mask portions of the metal mask 112 mask the pixel regions formed at portions where the electrode portions 161 and transparent electrodes 102 overlie each other. Therefore, the pixel regions are not exposed to the radiation heat 121 during deposition, and damage to the organic substance can be prevented.

According to the manufacturing method described above, the temperature of the glass substrate 101 after formation of the electrode portions 161, and the temperature of the glass substrate 101 after formation of the interconnections 162 are respectively 40° C. or less. In contrast to this, according to the conventional method, the temperature of the glass substrate after formation of the 200-nm thick electrode portions is 150° C. Concerning the glass transition temperature of each organic film, that of the red-emitting layer 104a is 175° C., that of the green-emitting layer 104b is 95° C., that of the blue-emitting layer 104c is 100° C., and that of the electron transport layer 105 is 85° C. Hence, the temperature of the glass substrate 101 can be suppressed to be sufficiently lower than the glass transition temperature of each organic film. As a result, damage to the organic film such as formation of a pinhole due to agglomeration of the organic film can be prevented.

Figure 7A:
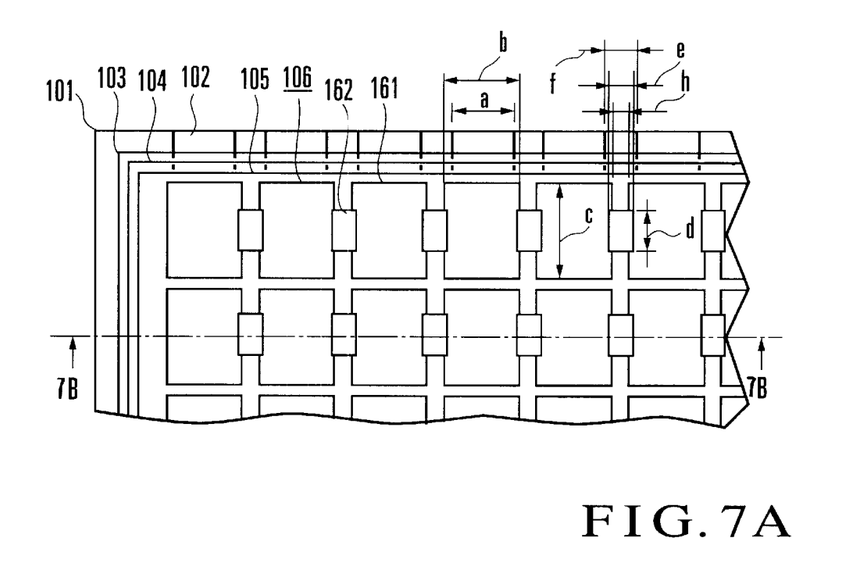
FIG. 7A is a plan view of a monochromatic organic thin film EL panel according to the second embodiment of the present invention.
Figure 7B:
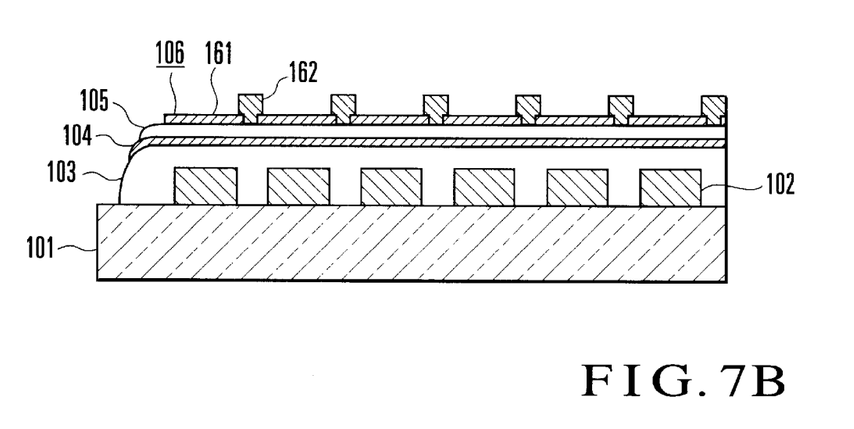
FIG. 7B is a sectional view taken along the line 7B—7B in FIG. 7A.

FIGS. 7A and 7B show a monochromatic organic thin film EL panel according to the second embodiment of the present invention. In FIGS. 7A and 7B, the same portions as in FIGS. 1A and 1B are denoted by the same reference numerals as in FIGS. 1A and 1B, and a detailed description thereof will be omitted.

In the monochromatic organic thin film EL panel shown in FIGS. 7A and 7B, a monochromatic light-emitting layer 104 is formed on the entire surface of a hole transport layer 103 to cover transparent electrodes 102. A transparent substrate 101 is a glass substrate, and has a thickness of 1.1 mm. The transparent electrodes 102 are made of ITO films each having a thickness of 100 nm, a sheet resistance of 15 Ω/□, and a pattern width a of 0.3 mm, and are arranged such that an insulating distance f among the transparent electrodes 102 becomes 0.1 mm. The hole transport layer 103 is made of α-NPD and has a thickness of 50 nm on the transparent electrodes 102. The light-emitting layer 104 is formed of a 50-nm thick organic film obtained by doping $Alq_3$ with quinacridone at a concentration of 5 wt %. An electron transport layer 105 is formed of a 50-nm thick $Alq_3$ film.

The electrode portions 161 are made of a magnesium-silver alloy having a magnesium-to-silver ratio of 10:1, and their thickness is set to 50 nm so the organic film will not be damaged by heat radiated from the vapor source even with a low vapor deposition rate. A pattern length b of the electrode portions 161 is set to 0.35 mm, which is larger than a pattern width a of the transparent electrodes 102, so that the interconnections 162 are not formed on the pixels. Hence, when depositing interconnections 162, the pixels are masked to protect the organic films from heat radiated from the vapor source. An insulating distance h among the electrode portions 161 is set to 0.05 mm. The interconnections 162 are made of copper. The thickness of the interconnections 162 is set to 1,000 nm, and their pattern length e is set to 0.08 mm so copper will not be deposited on the pixels.

A method of manufacturing the monochromatic organic thin film EL panel having the above arrangement will be described.

A 100-nm thick ITO film is formed on the 1.1-mm thick glass substrate 101 by sputtering, and the transparent electrodes 102 having an interconnection pitch of 0.4 mm and the pattern width a of 0.3 mm are formed by photolithography and wet etching.

The glass substrate 101 on which the transparent electrodes 102 are formed is placed in a vacuum deposition apparatus. The interior of the chamber is evacuated by a vacuum pump to $1 \times 10^{-3}$ Pa or less, and α-NPD is uniformly deposited on the transparent electrodes 102 to a thickness of 50 nm to form the hole transport layer 103. $Alq_3$ and quinacridone are uniformly co-deposited to a thickness of 50 nm at such a deposition rate that the doping concentration becomes 5 wt %, thereby forming the light-emitting layer 104. $Alq_3$ is uniformly deposited to a thickness of 50 nm, thereby forming the electron transport layer 105.

Subsequently, in the same manner as in the first embodiment, the electrode portions 161 are formed on the surface where the electron transport layer 105 is formed, by using an electrode portion metal mask 110 (FIG. 3), and then the interconnections 162 are formed by using an interconnection metal mask 112 (FIG. 5).

According to the manufacturing method described above, the temperature of the glass substrate 101 after formation of the electrode portions 161, and the temperature of the glass substrate 101 after formation of the interconnections 162 are respectively 40° C. or less. In contrast to this, according to the conventional method, the temperature of the glass substrate after formation of the 200-nm thick electrode portions 161 is 150° C. The glass transition temperatures of the light-emitting layer 104 and electron transport layer 105 are 95° C. and 85° C., respectively. Hence, the temperature of the glass substrate 101 can be suppressed to be sufficiently lower than the glass transition temperature of each organic film. As a result, damage to the organic film such as formation of a pinhole, due to agglomeration of the organic film near the glass transition temperature, can be prevented.

In the above embodiments, the interconnections 162 may be formed such that the pattern width d of the openings 113 of the interconnection metal mask 112 with respect to the vertical width c of the pixel satisfies d=c or d>c.

As has been described above, according to the present invention, the metal electrode is formed of the electrode portion and the interconnection, and the thickness of the electrode portion is set between 10 nm and 500 nm. Therefore, a time during which the glass substrate is exposed to heat radiated from the vapor source is shortened, and the temperature rise of the glass substrate can accordingly be suppressed.

When forming the interconnections, the interconnection metal mask which masks the pixel regions is used. Heat radiated from the vapor source is blocked by the mask and the pixel regions are not heated, so that the temperature rise of the pixel region can be suppressed.

As a result, through formation of the electrode portions and the interconnection, the temperature of the pixel regions is suppressed to be sufficiently lower than the glass transition temperature of the organic film. Therefore, damage to the organic film such as formation of a pinhole, caused by agglomeration of the organic film near the glass transition temperature, can be prevented.

Each metal electrode is formed of the electrode portion and the interconnection separately, and the pixel regions are masked during formation of the interconnections. The organic film of the pixel region can be prevented from being damaged by radiation heat produced during vapor deposition. A metal having a low resistivity and a high melting point can be deposited without being limited by the work function. Since this can decrease the interconnection resistance of the metal electrodes, variations in brightness among the light-emitting elements can be decreased.

Since the thickness of the electrode portions is set between 10 nm and 500 nm, during formation of the electrode portions, a time during which the mask is exposed to heat radiated from the vapor source is shortened. Hence, a temperature rise of the mask is suppressed, and detour of the deposition material caused by distortion or deflection of the mask is suppressed. As a result, an electrode portion pattern having a small pixel-to-pixel space can be formed, so that a pixel having a large operture ratio can be formed.

What is claimed is:

1. An organic thin film EL panel comprising:

a plurality of transparent electrodes formed into stripes on a transparent substrate;

an organic deposition film including a light-emitting layer and formed on said transparent substrate and said transparent electrodes; and a plurality of metal electrodes formed into stripes on said organic deposition film in a direction perpendicular to said transparent electrodes, said metal electrodes being comprised of a plurality of electrode portions arranged at a predetermined interval, and a plurality of interconnections that connect adjacent ones of said electrodes portions to each other, said electrode portions having pixel regions where said metal electrodes and said transparent electrodes overlie each other, and connection regions other than said pixel regions where said metal electrodes and said transparent electrodes do not overlie one another, and said interconnections connecting said connection regions of adjacent ones of said electrode portions to each other.

2. A panel according to claim 1, wherein said electrode portions have a thickness of 10 nm to 500 nm.

3. A panel according to claim 1, wherein said electrode portions are made of a material having a small work function, and said interconnections are made of a material having a low resistivity.

4. A panel according to claim 1, wherein each of said electrode portions forms a rectangular shape having two sides of b×c (c is a length of one side along which said metal electrodes are arranged), each of said pixel regions forms a rectangular region of a×c (b>a) at a center of each of said electrode portion in a direction along which said metal electrodes are arranged, and each of said connection regions forms a rectangular region of (b−a)/2×c on each of two sides of each of said electrode portions in a direction along which said metal electrodes are arranged.

5. A panel according to claim 1, wherein each of said interconnections forms a rectangular shape, and f>e>h is satisfied where e is a length of each of said interconnections in a direction along which said metal electrodes are arranged, h is an insulating distance among said electrode portions, and f is an insulating distance among said transparent electrodes.

6. A panel according to claim 1, wherein said organic deposition film is comprised of a hole transport layer formed on said transparent substrate to cover said transparent electrodes, said light-emitting layer formed on said hole transport layer to correspond to said transparent electrodes, and an electron transport layer formed on said hole transport layer to cover said light-emitting layer.

7. A panel according to claim 6, wherein said light-emitting layer is comprised of a red-emitting layer, a green-emitting layer, and a blue-emitting layer corresponding to said transparent electrodes and having a predetermined repetition pattern.

8. A method of manufacturing an organic thin film EL panel, comprising the steps of forming a plurality of transparent electrodes into stripes on a transparent substrate;

forming an organic deposition film including a light-emitting layer on said transparent substrate and said transparent electrodes; and forming a plurality of metal electrodes into stripes on said organic deposition film in a direction perpendicular to said transparent electrodes, said metal electrodes being comprised of a plurality of electrode portions arranged at a predetermined interval, and a plurality of interconnections that connect adjacent ones of said electrode portions to each other, the step of forming said metal electrodes comprising the steps of depositing an electrode material by using a first mask having a plurality of openings corresponding to pixel regions where said metal electrodes and said transparent electrodes overlie each other, thereby forming said electrode portions, and depositing an interconnection material by using a second mask which masks said pixel regions and which has a plurality of openings corresponding to interconnection regions among said electrode portions, thereby forming said interconnections.

9. A method according to claim 8, wherein the step of forming said electrode portions comprises the step of depositing said electrode material to a thickness of 10 nm to 500 nm.

10. A method according to claim 8, wherein the step of forming said electrode portions comprises the step of depositing a material having a small work function, and the step of forming said interconnections comprises the step of depositing a material having a low resistivity.

11. The method according to claim 8, wherein the step of forming said electrode portions comprises the step of forming said electrode portions to include pixel regions where said metal electrodes and said transparent electrodes intersect each other, and connection regions other than said pixel regions, and the step of forming said interconnections comprises the step of forming said interconnections so as to connect said connection regions of adjacent ones of said electrode portions to each other.

* * * * *